United States Patent [19]
Montreuil

[11] Patent Number: 5,477,199
[45] Date of Patent: Dec. 19, 1995

[54] DIGITAL QUADRATURE AMPLITUDE AND VESTIGIAL SIDEBAND MODULATION DECODING METHOD AND APPARATUS

[75] Inventor: Leo Montreuil, Atlanta, Ga.

[73] Assignee: Scientific-Atlanta, Inc., Norcross, Ga.

[21] Appl. No.: 319,694

[22] Filed: Oct. 7, 1994

Related U.S. Application Data

[63] Continuation-in-part of Ser. No. 223,223, Apr. 5, 1994.

[51] Int. Cl.⁶ .............................. H03C 1/60; H03D 1/24; H04L 27/36; H04L 27/38
[52] U.S. Cl. .................... 332/103; 329/308; 329/357; 348/639; 348/642; 348/727; 348/641; 375/261; 375/298; 375/301; 375/321; 375/324
[58] Field of Search .................... 329/304, 306, 329/307, 308, 309, 310, 357; 332/103, 104; 348/638, 639, 641, 642, 726, 727; 375/261, 298, 301, 321, 324; 455/47, 109, 204

[56] References Cited

U.S. PATENT DOCUMENTS

| | | | |
|---|---|---|---|
| 3,902,018 | 8/1975 | Fockens | 179/15 BT |
| 4,253,118 | 2/1981 | Flasza | 358/188 |
| 4,323,924 | 4/1982 | Flasza | 358/188 |
| 4,339,772 | 7/1982 | Eilers et al. | 358/144 |
| 4,405,944 | 9/1983 | Eilers et al. | 358/144 |
| 4,490,743 | 12/1984 | Mycynek et al. | 358/197 |
| 4,602,287 | 7/1986 | Fockens | 358/197 |
| 5,040,063 | 8/1991 | Citta et al. | 358/141 |
| 5,043,812 | 8/1991 | Citta et al. | 358/141 |
| 5,087,975 | 2/1992 | Citta et al. | 358/183 |
| 5,136,381 | 8/1992 | Citta et al. | 358/141 |
| 5,144,431 | 9/1992 | Citta et al. | 358/141 |
| 5,181,112 | 1/1993 | Citta et al. | 358/141 |

OTHER PUBLICATIONS

GI, Zenith In Compression Cross–License, *Electronic News*, Feb. 14, 1994.
Test of Zenith 16 VSB Transmission System, Cable Television Labs, Alexandria, Va. 22314, May 3–5, 1993, by Williams and James.
Practical Implementation of a 43 MBIT/SEC. (8 BIT/HZ) Digital Modem for Cable Television, Zenith Electronics Corp., by Rich Cita and Ron Lee, NCTA 1993, San Francisco, Calif.
Data Transmission, McGraw Hill, Bennett & Davey, 1965, Chapter 13.

(List continued on next page.)

*Primary Examiner*—Siegfried H. Grimm
*Attorney, Agent, or Firm*—Banner & Allegretti, Ltd.

[57] ABSTRACT

A synchronous detector for demodulating and decoding a digital data signal modulated either according to a vestigial sideband or a quadrature amplitude modulation scheme is based upon the principle of recognizing that a vestigial sideband signal may be regarded and treated as an offset-keyed QAM signal. The detector comprises a tuner for tuning to a center frequency symmetrically displaced within the transmitted digital data signal frequency spectrum and a decoder circuit selectively operating to reconstruct the transmitted digital data stream according to the duration of a transmitted data symbol. A related method of demodulating and decoding a modulated digital data stream comprises analogous steps of tuning to a center carrier frequency and selectively switching between in phase and quadrature arms of the demodulator such that the switch resides in one position or the other for a duration equal to half the duration of a transmitted data symbol. A related modulator for modulating a digital data signal either according to a vestigial sideband or quadrature amplitude modulation scheme comprises a switch for selectively switching an input digital data signal between real and imaginary arms and a modulator for modulating at center frequency. In one modulator embodiment, a noise cancellation circuit may be coupled between the real and imaginary arms.

18 Claims, 14 Drawing Sheets

OTHER PUBLICATIONS

Communications Systems, B. P. Lathi, John Wiley & Sons, Inc., 196–200, 1968.

Frequency and Phase Lock Loop, *IEEE Transactions on Consumer Electronics*, vol. CE–23, No. 3, Aug. 1977.

CableLabs, Ops Spar on MPEG Standard, *Multichannel*, vol. 15, No. 20, May 16, 1994.

The Digital Spectrum–Compatible HDTV Transmission System, *IEEE Transactions on Consumer Electronics*, vol. 37, No. 3, Aug. 1991, pp. 469–475.

DIGITAL QUADRATURE AMPLITUDE AND VESTIGIAL SIDEBAND MODULATION DECODING METHOD AND APPARATUS

This application is a continuation-in-part of U.S. application Ser. No. 08/223,223, filed Apr. 5, 1994.

BACKGROUND OF THE INVENTION

1. Field of the Invention

The field of the invention relates to a demodulating and digital decoding method and apparatus for demodulating and decoding a quadrature amplitude modulated or a vestigial sideband modulated digital data signal permitting utilization of substantially the same apparatus for demodulating either form of modulation.

2. Description of Related Art

FIG. 1A is repeated here from applicant's copending U.S. application Ser. No. 08/223,223, filed Apr. 5, 1994, entitled Synchronous Detector and Methods for Synchronous Detection, incorporated herein by reference, to show a typical signal amplitude versus frequency density spectrum of an information signal modulated via a vestigial sideband modulation scheme. In particular, FIG. 1A shows a vestigial sideband (VSB) modulated information signal modulated about a carrier frequency $f_c$. In particular, the carrier frequency signal is practically absent, the frequency component at the carrier frequency being primarily the information signal. The slopes on either side of the information signal frequency spectrum versus amplitude are ideally identical.

Referring to FIG. 1B, a known quadrature amplitude modulated (QAM) signal has a frequency spectrum which differs from that of FIG. 1A in that the QAM carrier frequency signal is symmetrically placed midband between $f_c$ shown in FIG. 1A and $f_c+(f_b/2)$ where $f_b$ is the baud rate of the modulated digital data information signal. The QAM modulated information signal is demodulated assuming a center carrier frequency $f_{cs}$, where "$f_{cs}$" refers to the frequency value equal to the approximate center of symmetry of the information signal spectrum.

In a conventional demodulator for a VSB modulated data signal in which the transmitted carrier is suppressed or partially suppressed, the demodulation apparatus typically includes a synchronous product detector tuned to the carrier frequency $f_c$. In a typical demodulator for the QAM data signal, the demodulation apparatus involves the use of two product detectors, one tuned to $f_{cs}$, or $f_c+(f_b/4)$, and the other to the quadrature of $f_{cs}$.

As television technology has progressed toward today's required resolution requirements permitting display of a high definition television image, it has become necessary to develop and agree upon a modulation scheme for a digital data signal capable of transmission via cable, optical fiber, satellite or over-the-air at very high, ultra-high, microwave or higher radio frequencies (including light frequencies). The transmitted digital data signal, itself, includes both a digitized and compressed television information signal and a related stereo audio signal and further may include other data signals. These other data signals may be superimposed on either of the television or stereo audio signals or separately transmitted in a frequency division or time division multiplex format. The modulation techniques presently under consideration are the subject of considerable controversy and include both VSB and QAM. Some proponents of one high definition television standard are promoting VSB while others are promoting QAM. For example, 16-QAM is a technique where a sequence of four bit data nibbles are split into two separated sequences of two bit symbols per sequence. The two separated sequences of symbols are fed into the two modulation ports of a quadrature type modulator. QAM output signals are double sideband (as per FIG. 1B), and the sidebands bear no particular phase relationship to each other due to asymmetry between the two separate sequences of symbols formed during the modulation process.

In contrast, 4-VSB is a technique where the same sequence of four bit nibbles is split in two consecutive two bit nibbles transmitted at twice the symbol rate used in QAM. The bandwidth is made comparable to the QAM modulated signal's bandwidth by eliminating one redundant sideband.

The known modulation and demodulation methods vary between QAM and VSB. So does the structure of a typical modulator circuit or a demodulator circuit. One synchronous detector for VSB demodulation is shown in FIG. 2 substantially copied from FIG. 24 of applicant's copending U.S. application Ser. No. 08/223,223. The VSB demodulator typically varies from one for QAM demodulation in the requirement to tune to different frequencies $f_c$ versus $f_c+(f_b/4)$) and to maintain control of the one or the other tuned frequency output of the local carrier voltage-controlled oscillator (VCO).

There is reason to believe that representatives of Cable-Labs, a cable television research and testing facility in the United States, have sought to develop a chip set that merges QAM and VSB modulation technology. The CableLabs modulation and demodulation method and chip set under development may have resulted in the preparation and filing of patent applications in the United States according to press releases. However, the particular details of the CableLabs development have not been published to the best of applicant's knowledge.

Consequently, in view of the controversy surrounding digital VSB and QAM demodulation, there remains a need in the art to provide apparatus and a method for digitally demodulating both types of modulation and thereby decoding a digital information signal modulated thereby. Desirably, such apparatus will avoid any need to retune to an anticipated carrier frequency, eliminate redundant circuitry and, yet, decode either modulated digital data signal without significant loss of content.

SUMMARY OF THE INVENTION

It is an object of the present invention to provide apparatus and a method for digitally demodulating both VSB and QAM modulated data.

It is a further object of the present invention that the apparatus for doing so be common, thus, substantially eliminating redundant circuitry.

It is a further object of the present invention to provide a digital decoder for outputting a demodulated data stream regardless of how the data stream is modulated and transmitted, via VSB or QAM.

It is a further object of the present invention to decode either a VSB or QAM signal with substantially no loss of digital data.

These and other objects are achieved according to the present invention through a recognition that a digital data signal modulated via VSB may be demodulated assuming a symmetric, center carrier frequency ($f_{cs}$). Consequently, a QAM demodulator circuit tuned to center frequency may be utilized for demodulating and passing a decodable digital data signal modulated either via QAM or VSB modulation to a decoder according to the present invention. In other words, a VSB modulated digital data signal may be viewed as an offset-keyed QAM signal. The received VSB or QAM signal is switched at a decoder, according to the symbol rate, in order to form the demodulated, decoded and reconstructed serial data stream which was transmitted.

Applicant performed a computer simulation comparing offset-keyed quadrature phase shift keying (O-QPSK) and 2-VSB. According to Table I, described in further detail herein, applicant utilized MATLAB (TM) computer circuit simulation software to do so. Table 4C shows a transmitted data sequence and FIGS. 4D and 4E show the received identical sequence assuming O-QPSK or VSB. According to the simulation results shown there, the received data sequences match the transmitted data sequences by either demodulation method.

Applicant simulated the output eye patterns of a 2-VSB signal demodulated using a typical VSB demodulator (tuned to $f_c$) and a QAM demodulator tuned to a symmetric, center frequency (tuned to $f_{cs}$) of the information signal frequency spectrum. Applicant noted that the resultant eye patterns from QAM demodulation (O-QPSK) of a VSB modulated digital data signal still presented an "open eye" (FIGS. 4A–7), even in the presence of a significant transmitted carrier (FIGS. 8A–11). On the other hand, applicant noted substantial differences in data eye patterns generated during demodulation of a 2-VSB modulated digital data signal assuming that the carrier tuning frequency is one at the customary $f_c$ (via a typical VSB synchronous detector) or symmetrically located mid-band at $f_{cs}=f_c+(f_b/4)$ (via a QAM demodulator).

Data eye patterns are obtainable at the output of a digital data demodulator typically through use of an oscilloscope. In the simulation associated with the development of the present invention, the eye patterns are formed graphically as the computer output of a printer. A random data signal is assumed which produces the printed output comprising the patterns in which open spaces are found between multiple overlapping sinusoidal appearing signals at fractions of the baud rate or the baud rate of the modulated data signal.

Applicant simulated the eye patterns obtainable by utilizing a standard QAM demodulator circuit tuned to $f_c+(f_b/4)$ and a standard VSB demodulator tuned to $f_c$ and discovered that in-phase or quadrature 2-VSB eye patterns resulted that were distinguishable from one another. Thus, if the VSB modulated data signal is assumed to be symmetrically displaced about the carrier, then the VSB signal can be viewed as an offset-keyed QAM signal (O-QPSK). Consequently, the same electronic circuitry may be utilized to recover a digital data signal modulated via either a QAM or VSB modulation method, assuming a particular decoding algorithm according to the present invention.

Applicant further simulated the respective constellation patterns resultant from in-phase versus quadrature demodulation for a 2-VSB modulated digital data signal assuming tuning at either $f_c$ or $f_c+(f_b/4)$. A decoder algorithm then was constructed incorporating means for outputting a QAM or VSB demodulated data stream including, but not limited to, the steps of switching between in phase and quadrature data sequences and, consequently, producing a reconstructed, serialized output data stream.

Consequently, in accordance with the present invention, a demodulator for demodulating a QAM or VSB modulated digital data signal comprises tuning means for tuning to a center frequency of the frequency spectrum of a modulated information signal and decoding means responsive to the tuning means for decoding the modulated information signal according to the symbol rate of the serial data stream, the serial data stream being a reconstructed serial data stream identical to the transmitted data stream. Differences between the respective constellations of the QAM or VSB modulated digital data signal are inherently taken into account. A method of demodulating a QAM or VSB modulated digital data signal comprises the steps of tuning to a center frequency of the frequency spectrum of a modulated information signal and decoding the modulated information signal according to the symbol rate of the transmitted digital data stream.

In this manner, hardware tuning and demodulation circuitry may be shared in a demodulator circuit for demodulating either a VSB or QAM modulated digital data signal while the primary difference in method or circuitry between decoding alone and decoding either QAM or VSB is in the decoder circuitry for outputting a reconstructed, demodulated digital data stream by switching between in phase and quadrature arms according to the symbol rate of the transmitted data stream. Other advantages of the present invention will become apparent from an understanding of the detailed description of the present invention which follows.

BRIEF DESCRIPTION OF THE DRAWINGS

FIGS. 8A–11 comprise simulated eye patterns and constellations for digital data signals demodulated either by assuming a center carrier frequency or one displaced to an edge of the information signal frequency spectrum as in FIGS. 4A–8B but in which a significant amplitude component at the carrier frequency is transmitted with the 2-VSB signal.

FIGS. 8A and 8B comprise a simulated eye pattern and constellation for a conventionally demodulated 2-VSB signal with added pilot signal; whereas FIGS. 10A and 10B comprise a simulated eye pattern and constellation for a demodulated VSB signal with added pilot signal according to the present invention.

DESCRIPTION OF THE PREFERRED EMBODIMENT AND METHOD

Figure 1A:
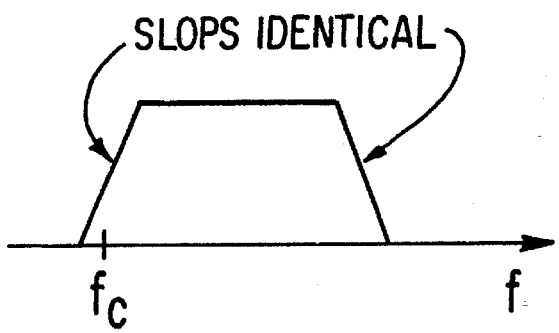
FIG. 1A is a graph showing a typical frequency density spectrum of an information signal modulated in accordance with vestigial sideband modulation methods wherein there is substantially no transmitted vestige of the carrier frequency $f_c$.

According to FIG. 1A, a VSB modulated digital data signal has a frequency signal spectrum in which the carrier frequency $f_c$ is displaced toward one edge of the frequency spectrum. The information signal, according to the present invention, is presumed to comprise a digital data signal or data stream having a baud rate $f_b$. The slope of either side of the information signal frequency spectrum is substantially identical. The carrier frequency amplitude component is presumed to be substantially absent. Thus, only the information signal spectrum is transmitted, for example, via cable, satellite, optical fiber, over-the-air or other transmission media. The baud rate may comprise that of a low speed data signal, that of audio, stereo audio, high speed data or high definition television. The data itself may be compressed or not in accordance with well known techniques.

Figure 1B:
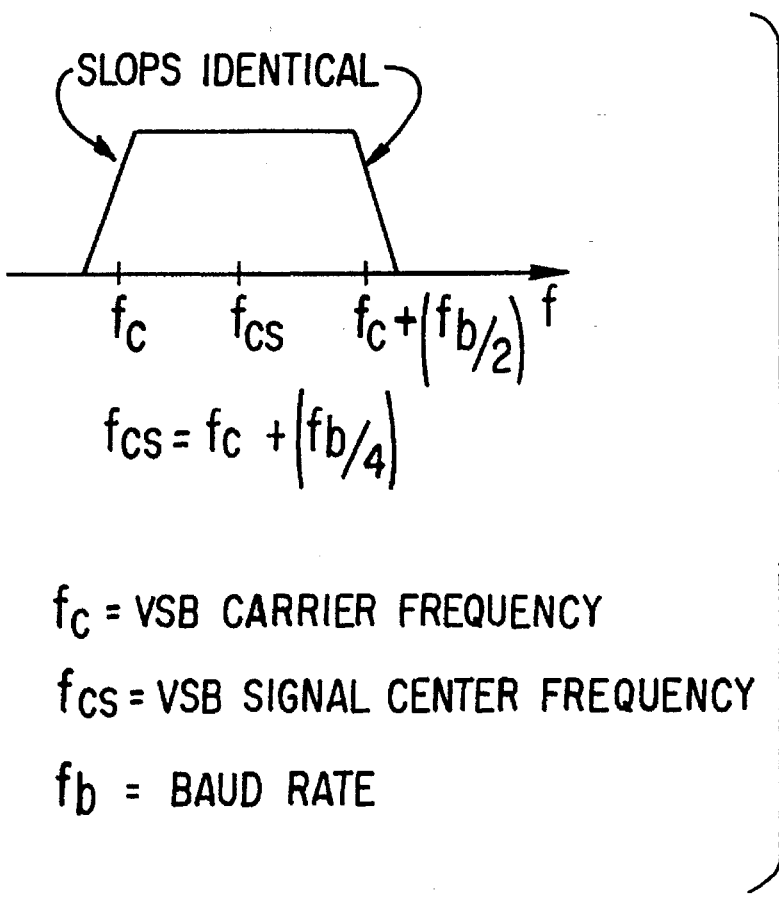
FIG. 1B is a graph showing a typical frequency density spectrum related to the VSB spectrum of FIG. 1A in which the carrier frequency is symmetrically assumed to be located at $f_c+(f_b/4)$ or at mid-band in accordance with a QAM modulated digital data signal having a baud rate $f_b$, where $f_{cs}$ is the frequency value at the center of symmetry of the information signal spectrum.
Figure 4A:
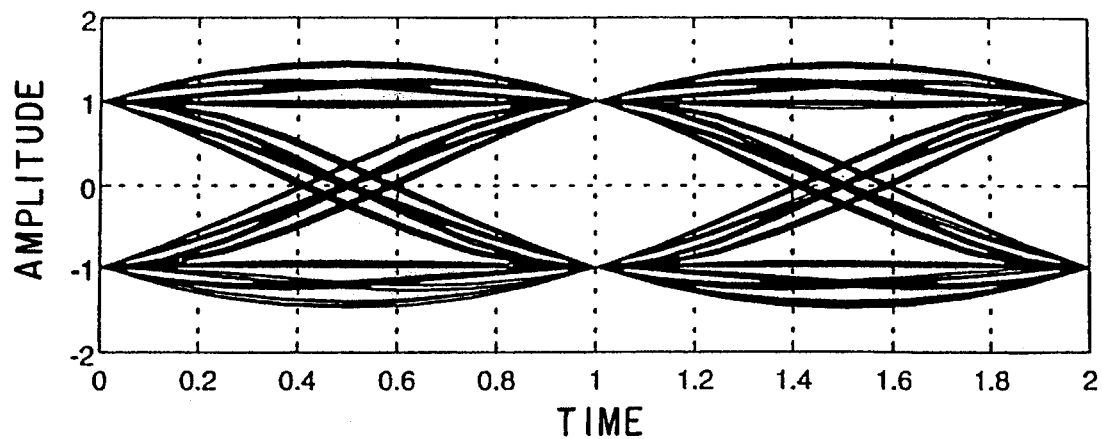
FIGS. 4A and 4B comprise a simulated eye pattern for the I and Q outputs demodulated from a 2-VSB signal assuming demodulation from tuning to the center of symmetry $f_{cs}$ as a QAM signal would typically be demodulated, treating the modulated data signal as O-QPSK modulated.
Figure 4B:
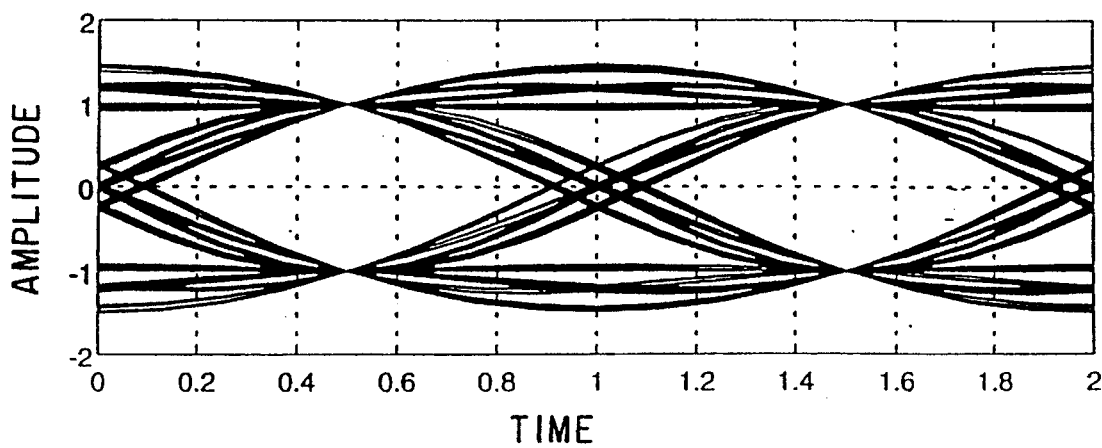
Figure 4C:
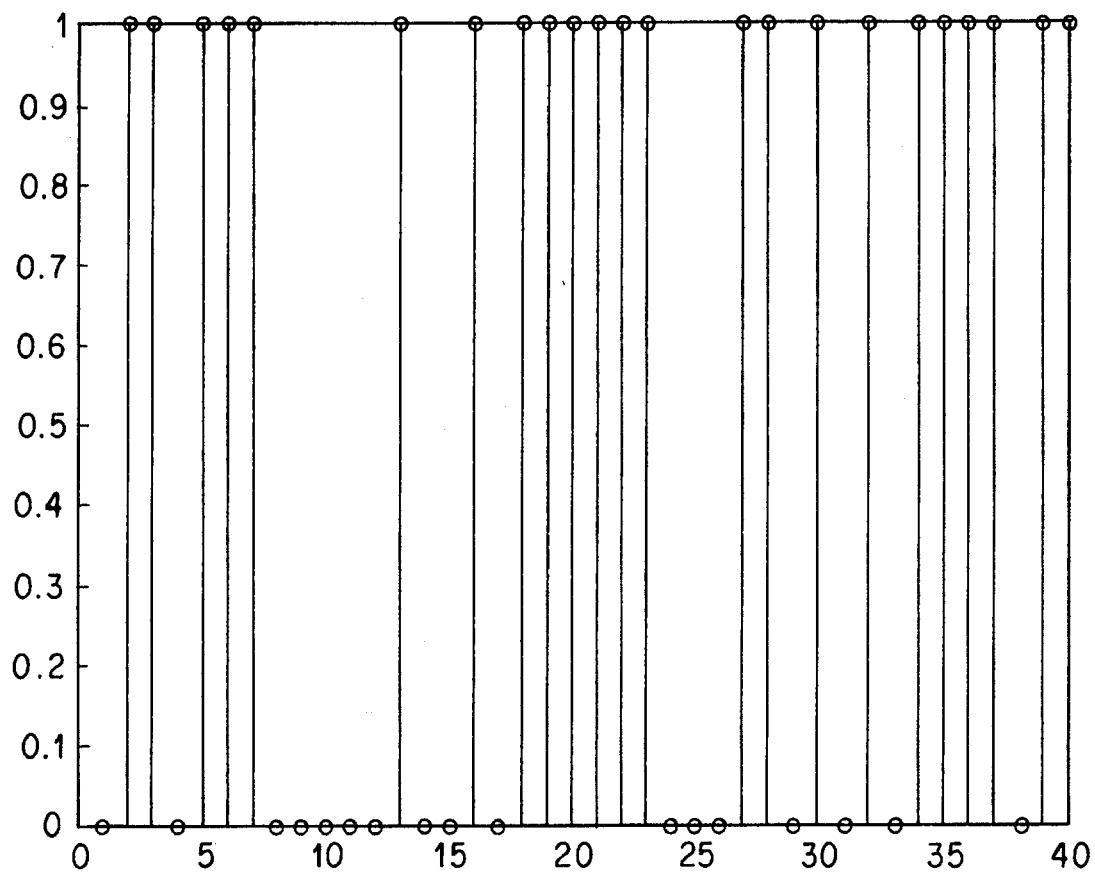
FIG. 4C graphically depicts the transmitted sequence for the simulation described by Table I.
Figure 4D:
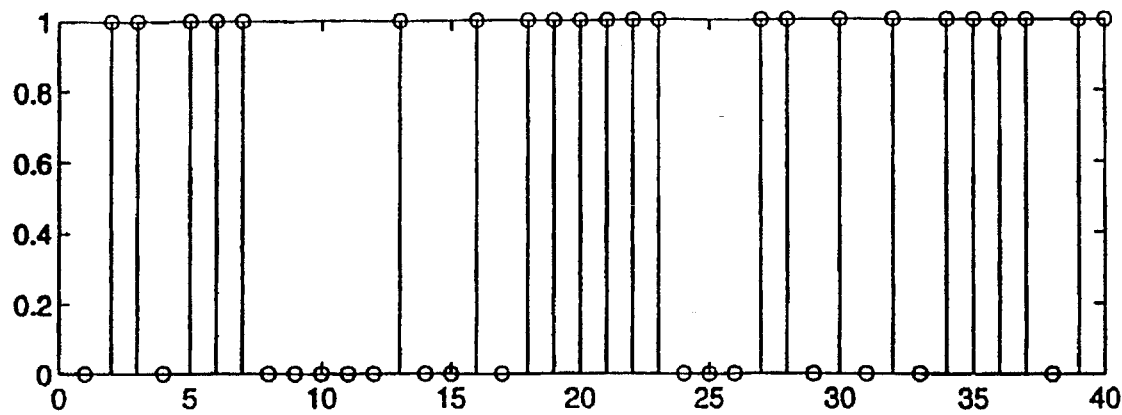
FIGS. 4D and 4E graphically depict the received data sequences upon simulated QAM demodulation (O-QPSK) showing that the received data sequences for O-QPSK and VSB are identical to each other and to the transmitted sequences.
Figure 4E:
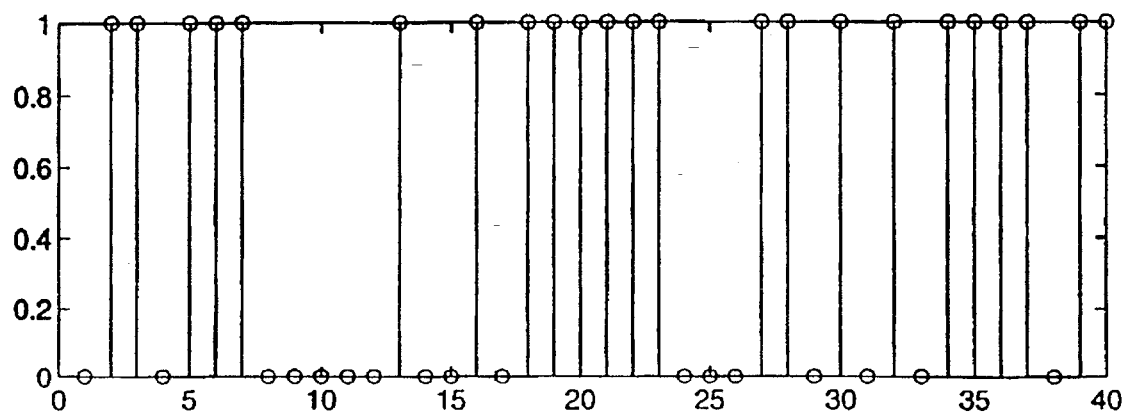
Figure 5:
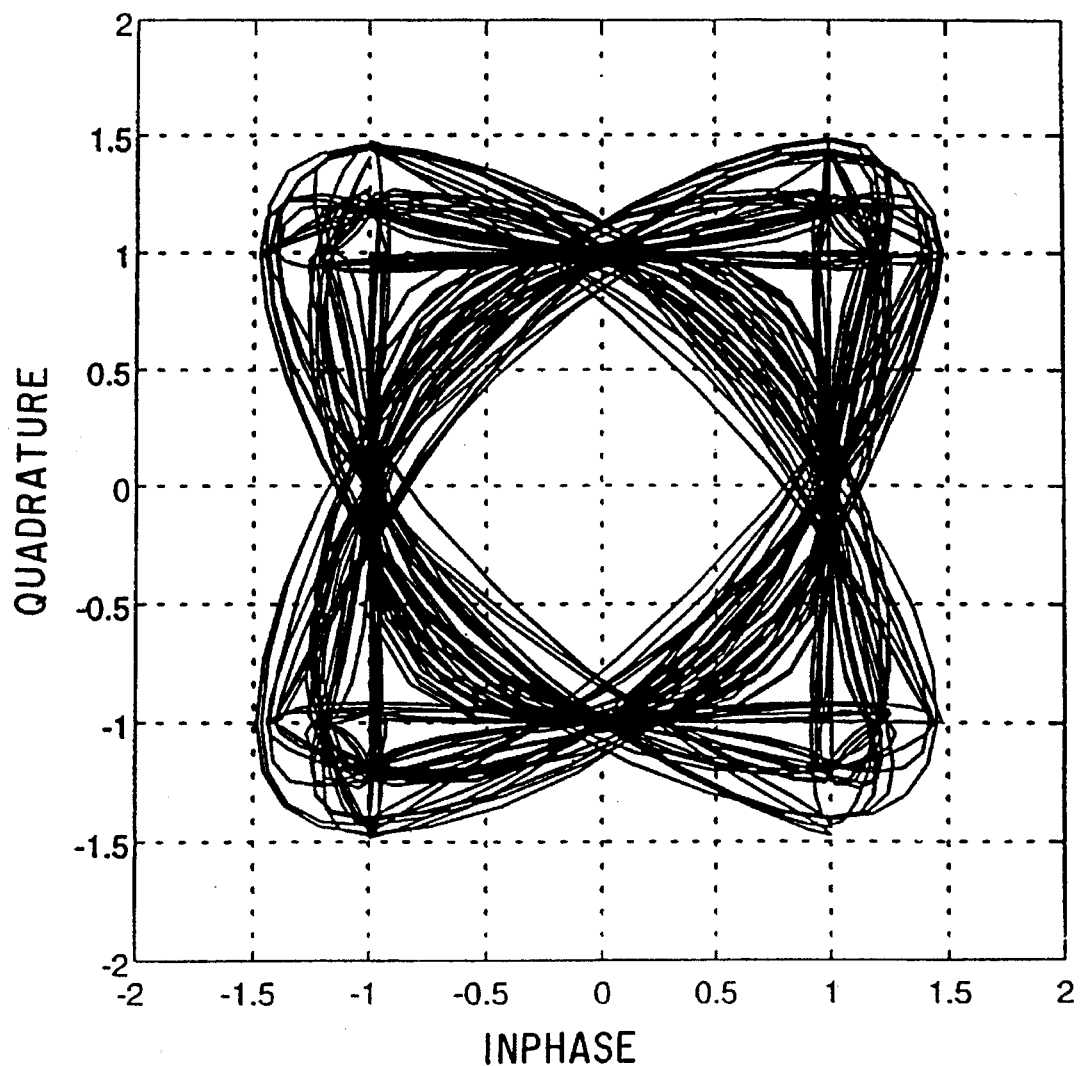
FIG. 5 comprises a simulated constellation for the demodulated digital data signal whose eye patterns for I and Q outputs are shown in FIGS. 4A and 4B.
Figure 6A:
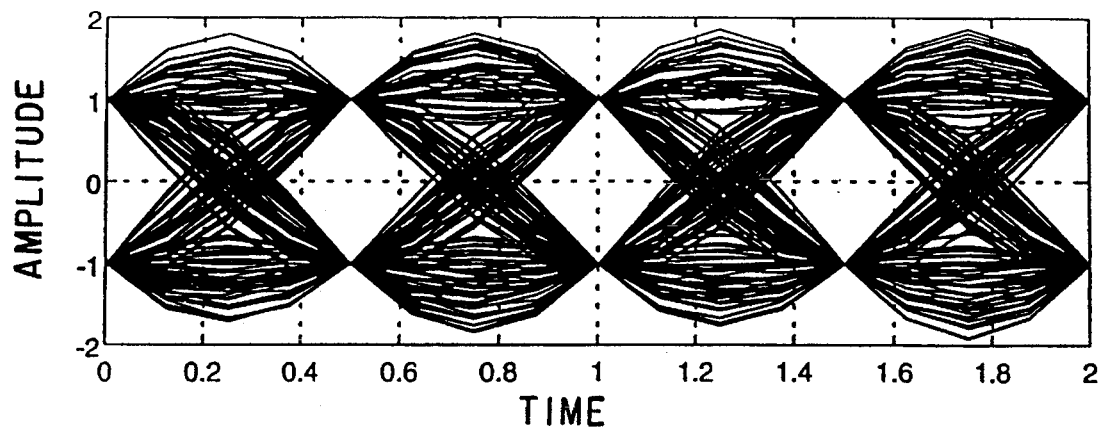
FIGS. 6A and 6B comprise a simulated eye pattern for the I and Q outputs of a 2-VSB signal demodulated using a conventional VSB demodulator tuned to a carrier frequency $f_c$ displaced to one or the other edge of the information frequency spectrum as shown in FIG. 1A.
Figure 6B:
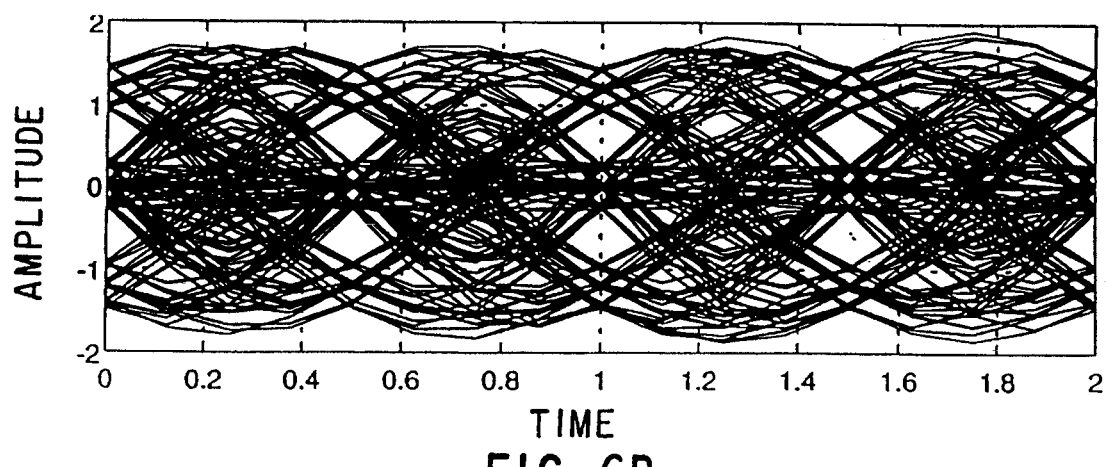

These characteristics of the digital data stream described as one for modulation via VSB likewise describe a digital data stream to be QAM modulated. Referring to FIG. 1B, and according to the present invention, a VSB modulated digital data signal may be regarded as an offset QAM or offset quadrature phase shift keyed (O-QPSK) data signal having in phase and quadrature amplitude components as shown in FIGS. 4A and 4B where the demodulation occurs at $f_{cs}$ as per FIG. 1B. A QAM signal may likewise be demodulated from $f_{cs}$, the center of symmetry of the information signal that has been QAM modulated.

The following Table I provides a MATLAB (TM) computer circuit simulation software file for demonstrating that VSB can be modulated and demodulated from center frequency $f_{cs}$, like a QAM signal. It is assumed for the purposes of the simulation that the VSB symbol rate is twice the symbol rate of O-QPSK. Moreover, the principles demonstrated by the simulation may be extended to more complicated data modulation schemes such as 4-VSB and so on.

TABLE 1

```
%        File to demonstrate that we can modulate and demodulate a VSB
signal
%        from it's center, like a QAM signal.
%        For this example we will compare O-QPSK and 2VSB.
%        The VSB symbol rate is twice the symbol rate of O-QPSK.
graph = 0;           % Set this to 1 to plot, 0 for not to plot
nbits = 512;         % Nb. of bits used in simulation
ns_qpsk = nbits/2;       %Nb. of O-QPSK symbols
ns_vsb = nbits; % Nb. of VSB symbols
fs = 8; % Sampling frequency used in simulation
Ts = 1; % Symbol time duration for O-QPSK
nsf = 8;     % Nb. of symbols memory of Nyquist filter.
load prbs11a; nbits = min(nbits, length (prbs)); prbsl = prbs(l:nbits);
nstart = 1 + nsf*fs*Ts;       % Index where signal is valid
nstop = fs*Ts*nbits;          % Index of end of signal
t = [0:1/fs:nbits*Ts-1/fs]';      % Time vector associated with simulation
%        Nyquist filter for I and Q arm of QPSK
[b,a] =   nyql(nsf*fs*Ts,1/(fs*Ts),50);
%        VSB filter created by rotating the zeros of Nyquist filter
[bt,at] =   filt_rot(b,a,1/(fs*Ts));
delay_filt = nsf*fs*Ts; % delay of filter in nb. of clock sample
% Generate an O-QPSK signal
xQPSK = fs*Ts*( zerofill (2*prbsl(1:2:nbits-1)-1,fs*Ts)...
            + j*rotatem( zerofill(2*prbsl(2:2:nbits)-1, fs*Ts),fs*Ts/2));
yQPSK = filter(b,a,xQPSK); % Filter O-QPSK with Nyquist filter
% O-QPSK to 2-VSB conversion using a complex exponential.
% Shifting in freq. by 1/(2*T).
%yVSB = YQPSK.* exp(j*2*pi*(1/(2*Ts).*t));
xVSB = fs*Ts*( zerofill(2*prbsl-1,fs*Ts/2));
yVSB = filter(bt,at,xVSB);
% Sample the O-QPSK inphase arm
bI_QPSK = sampbits(real(yQPSK), [fs,1/Ts],0.0);
% Sample the O-QPSK quadrature arm
bQ_QPSK = 0 sampbits(imag(yQPSK), [fs,1/Ts],0.5);
% Form a serial stream using [I,Q,I,Q,I,Q,....]
b_QPSK = [bI_QPSK,bQ_QPSK]';
b_QPSK = b_QPSK(:);
% Sample the VSB inphase arm
b_VSB = sampbits(real(yVSB),[fs,2/Ts],0.0);
% Convert from antipodal signal to 1 and 0
b_QPSK = (b_QPSK > 0.0);
b_VSB = (b_VSB > 0.0);
figure(1)
subplot(211)
stem(b_QPSK(101:140)); title('O-QPSK RECEIVED SEQUENCE');
subplot(212)
```

TABLE 1-continued

```
stem(b_VSB(101:140)); title('VSB RECEIVED SEQUENCE');
figure(2)
stem(prbsl(101-delay_filt/fs: 140-delay_filt/fs));
title('TRANSMITTED SEQUENCE');
```

Further simulation results are shown in FIGS. 4A–11. FIGS. 4A, 4B and 5–11 are simulations run according to certain assumed parameters, in particular, all are at an assumed sampling frequency Fs of 8 Hz and an alpha $\alpha = 50\%$. The center frequency of the offset QAM signal is 0 Hz using the complex baseband representation. Moreover, the carrier frequency of the VSB signal is 0 Hz. The symbol duration $T_s$ for 2-VSB is half that for O-QPSK or at 0.5 sec. (where O-QPSK is at 1 second) reflecting the splitting of the QAM digital stream. FIGS. 4A–7 are simulated results assuming no carrier pilot. FIGS. 8A–11 assume a transmitted vestige of pilot at approximately 0.2 volts (roughly 10% of the distance separating the two amplitude levels.) Yet, if it is desired to transmit even more significant carrier levels, a demodulator/decoder, according to the present invention, may be modified in a well known manner to track and remove the pilot this removing the depicted adverse effect on the eye pattern. Thus, with an additional circuit, the transmitted pilot is subtracted from the received waveform.

Figure 2A:
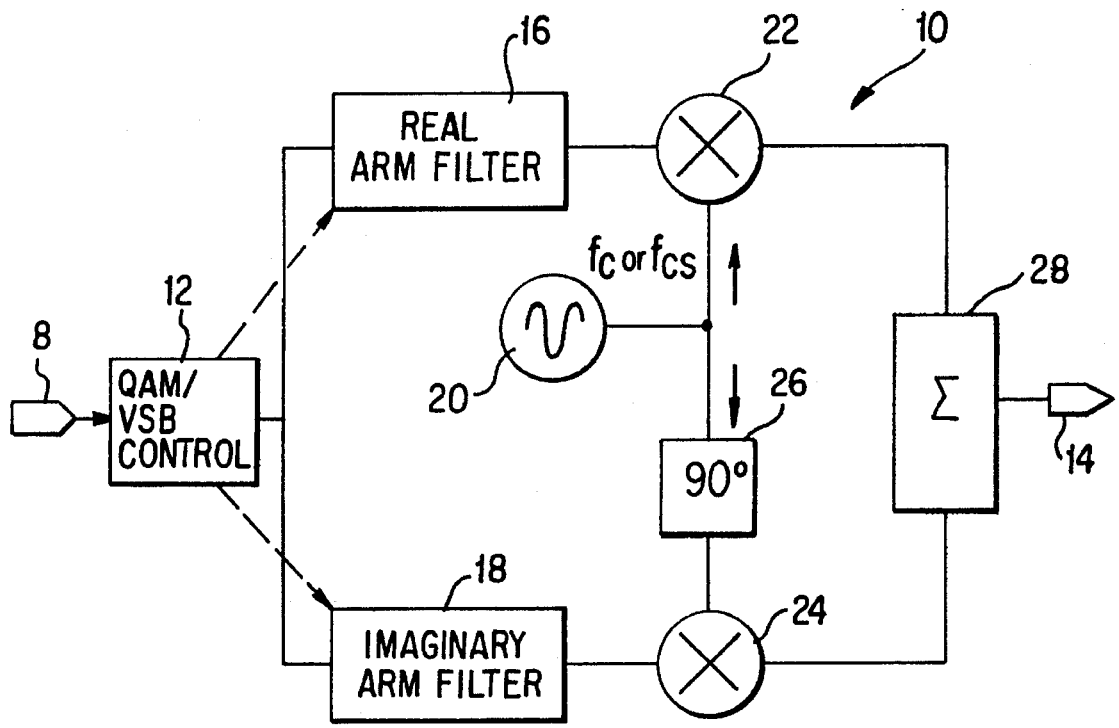
FIG. 2A comprises a block schematic diagram of a modulator for modulating a digital data signal either via VSB or QAM modulation including a QAM/VSB control circuit 12.
Figure 7:
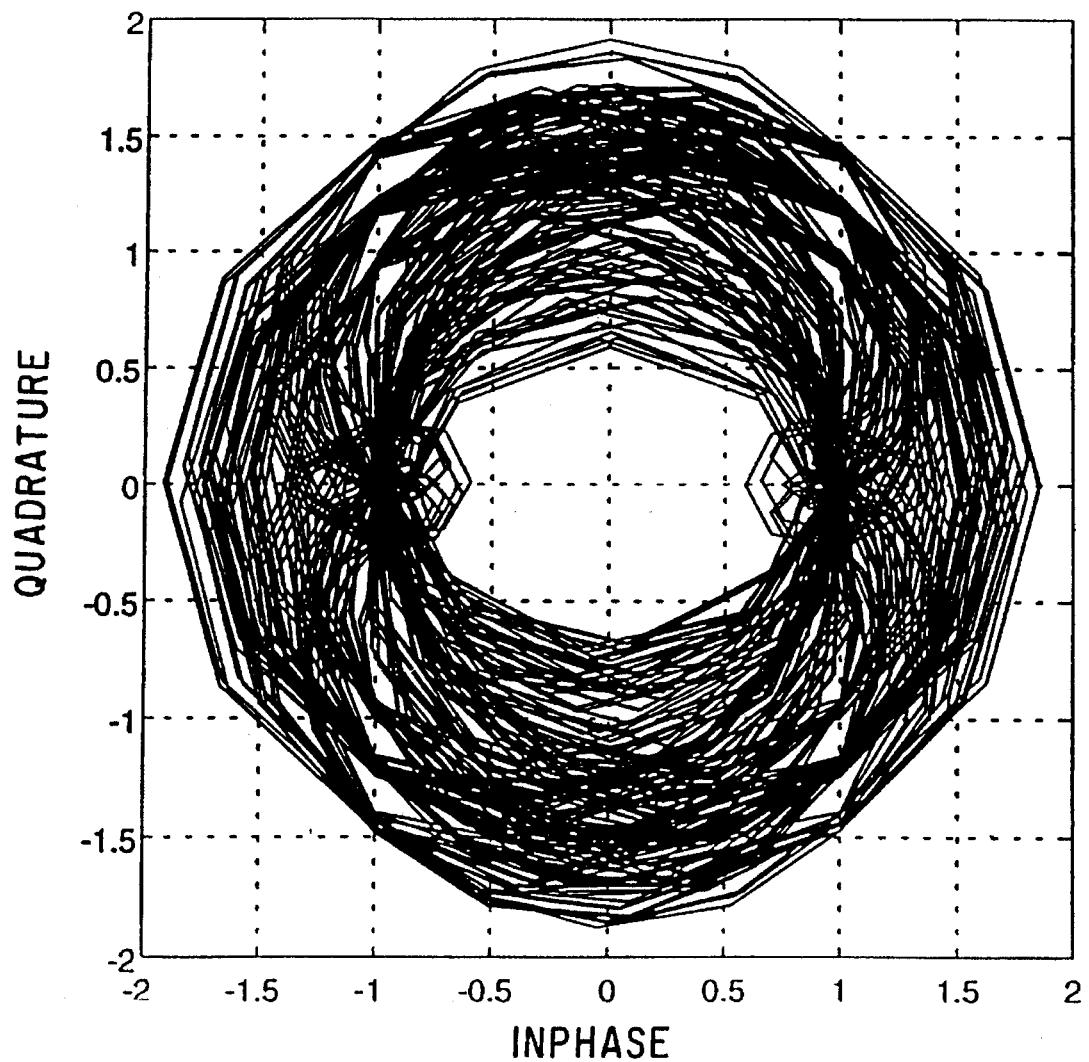
FIG. 7 comprises a simulated 2-VSB constellation for the demodulated digital data signal whose eye patterns for I and Q outputs are shown in FIGS. 6A and 6B.
Figure 8A:
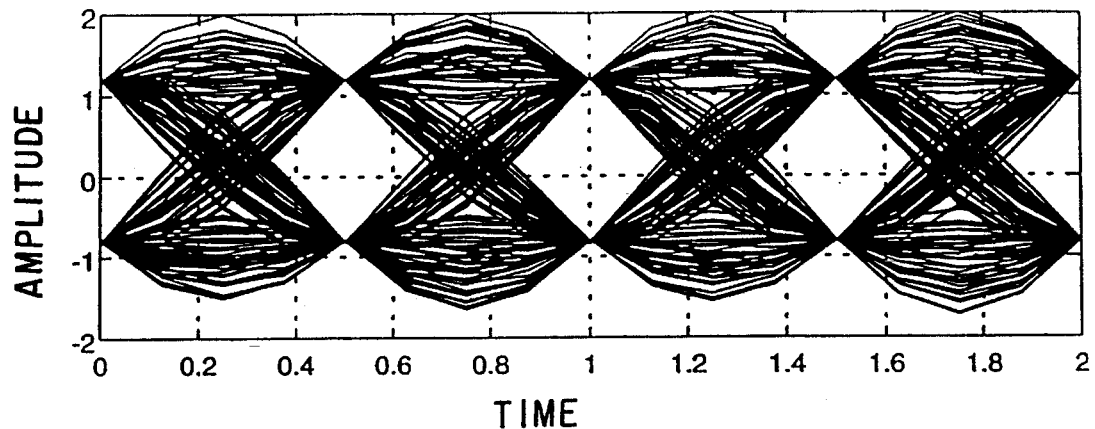
Figure 8B:
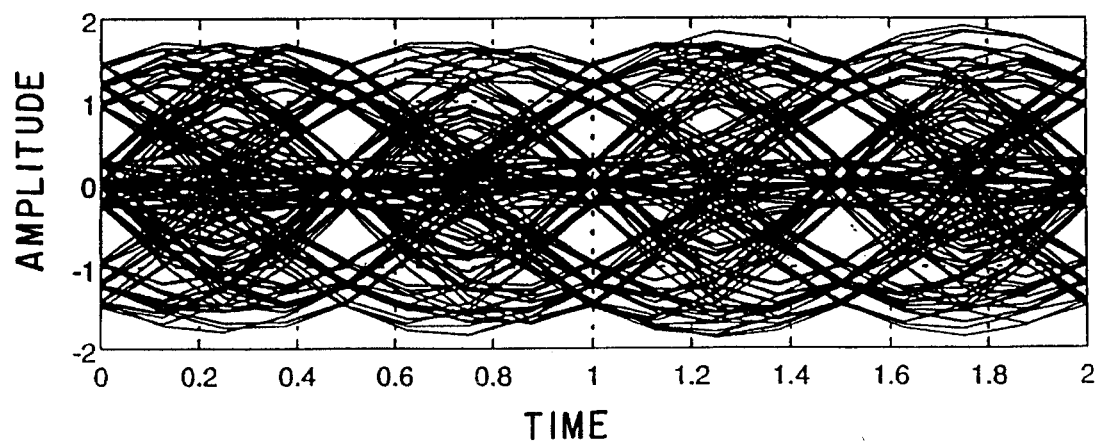
Figure 9:
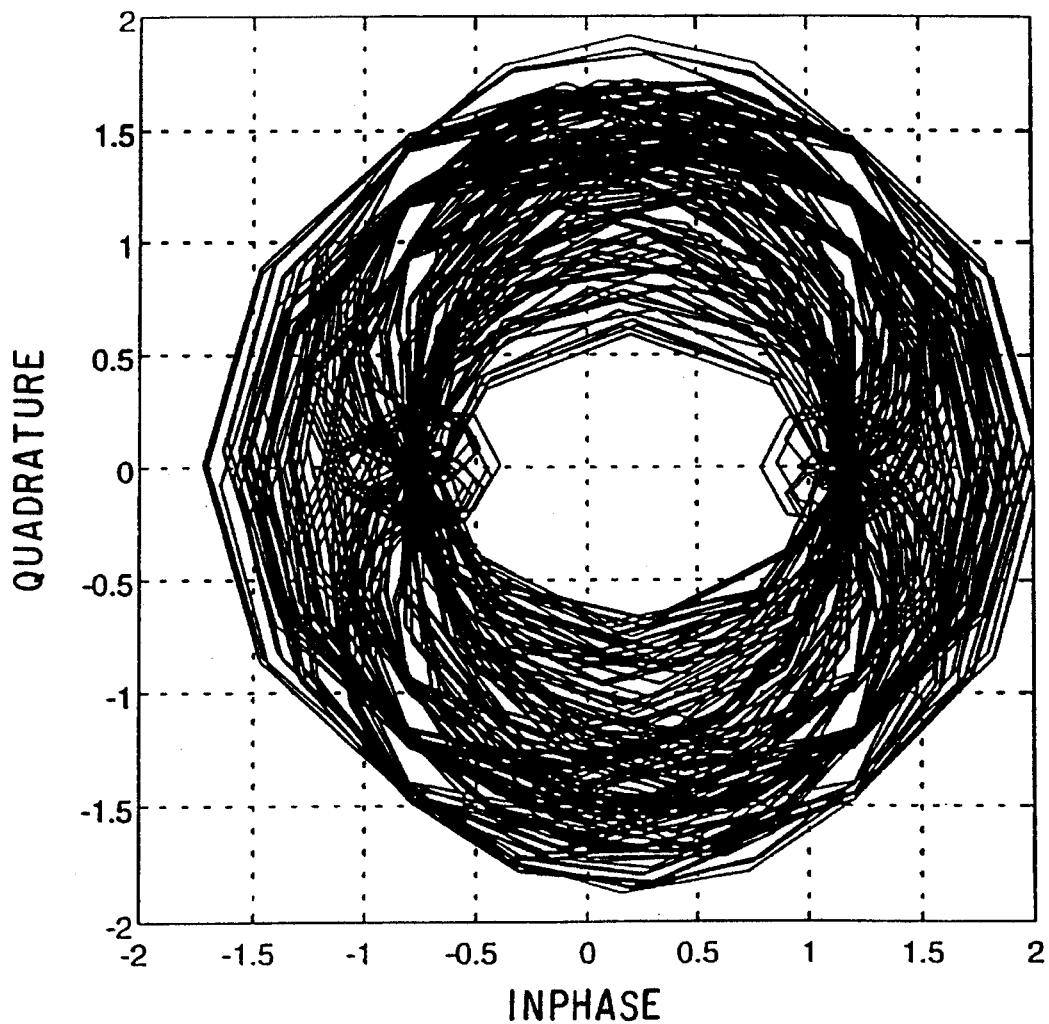
Figure 10A:
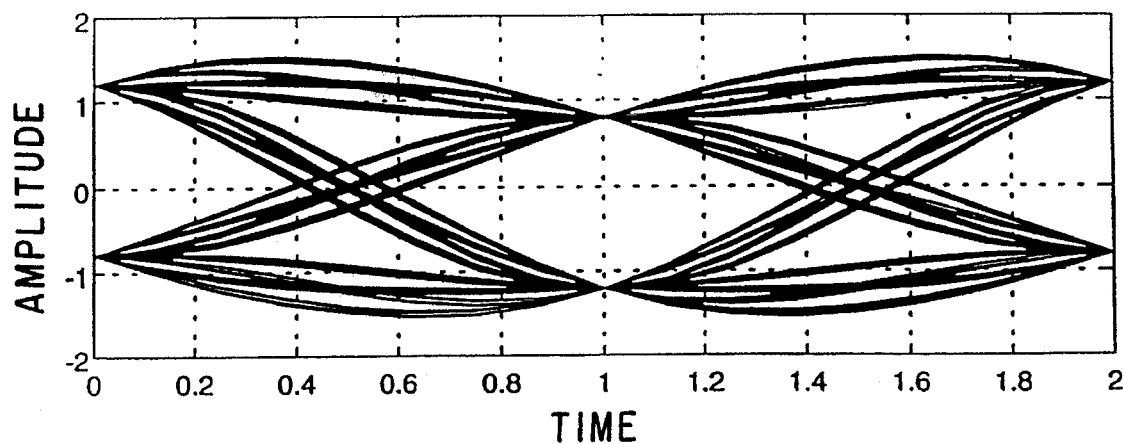
Figure 10B:
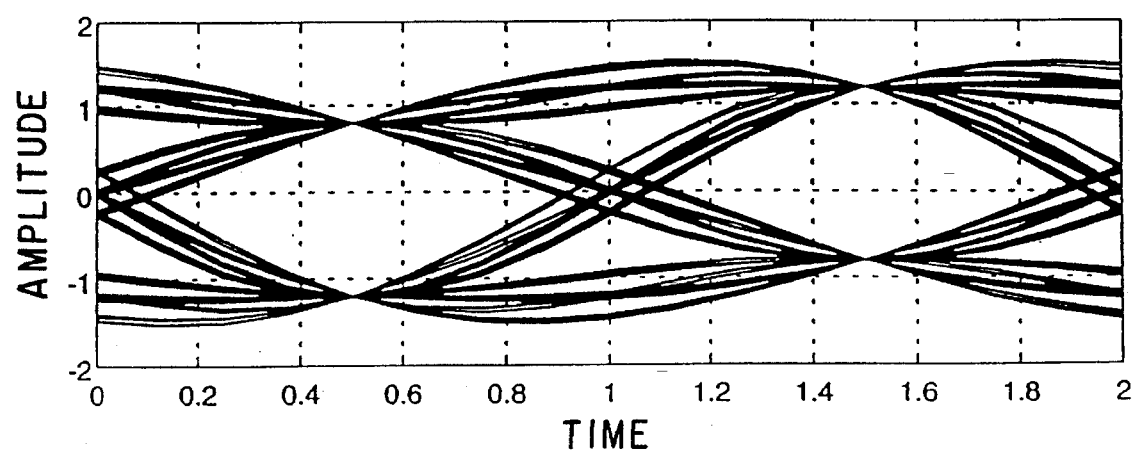
Figure 11:
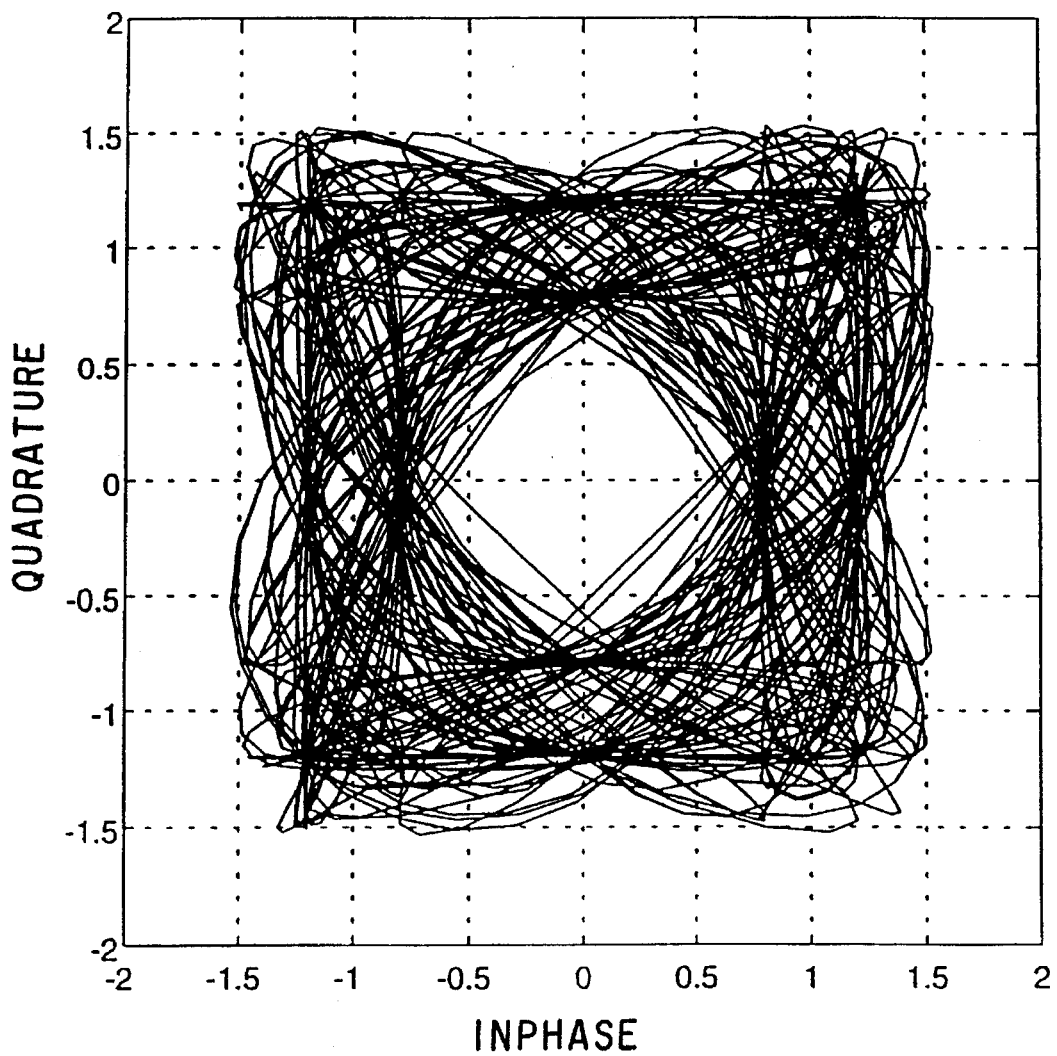

Referring now to FIG. 2A, substantially identical to FIG. 7 of my copending application, the similarities between VSB and QAM modulation of the same digital data stream will now be discussed. In FIG. 2A, however, an input digital data stream to be modulated is fed from input 8 to modulator 10 which comprises a modulator for modulating the data either via VSB or QAM modulation techniques. If the digital data signal is to be modulated via QAM, the signal is typically split into two separated data sequences to be fed via dashed line paths from controller 12 to filters 16 and 18, and to real and imaginary arms respectively. A digital data signal to be VSB modulated is passed via the solid line path to both filters 16 and 18.

Oscillator 20 generates a carrier signal at the carrier frequency, either $f_c$ (VSB) or $f_{cs}$ (QAM). The carrier signal is provided to both balanced modulator 22 and an input of, preferably, a Hilbert filter 26. Since the carrier signal frequency is substantially spectrally pure, filter 26 is merely a 90° phase shift filter at the carrier frequency. The output of filter 26 is provided to balanced modulator 24. The output of real arm 16 is provided to balanced modulator 22 to modulate the carrier signal. The output of balanced modulator 22 is provided to a first input of summing circuit 28. An output of imaginary arm 18 is provided to a second balanced modulator 24, and an output of balanced modulator 24 is provided to a second input of summing circuit 28. The output of summing circuit 28 is the modulated carrier signal and is provided at output terminal 14.

The modulator shown in FIG. 2A may produce single sideband modulation signals when imaginary arm 18 is a Hilbert filter to provide a 90° phase shift over the entire bandwidth of the passband of real arm filter 16. When summing circuit 28 adds the signals from balanced modulators 22 and 24, the upper sideband signal is provided at output terminal 14. When summing circuit 28 subtracts the signal from balanced modulator 24 from the signal from balanced modulator 22, the modulated carrier provided at output terminal 14 is the lower sideband signal.

Modulator 10 may be a QAM modulator when the data input comprises two separated data sequences feeding imaginary and real arms 16 and 18. The first data stream is provided to real arm filter 16, and the second data stream is provided to imaginary arm filter 18. When both real and imaginary arms 16 and 18 are Nyquist filters, the modulated carrier signal at output terminal 14 is then a quadrature amplitude modulated signal.

Modulator 10 may be a VSB modulator when the digital data stream input at input 8 is passed unsplit via the solid line path from control 12 to real and imaginary arms 16 and 18. Modulator 10 produces vestigial sideband modulated signals when the weights applied to the real and imaginary arms 16 and 18 are appropriately determined as described more fully in my copending application.

Figure 2B:
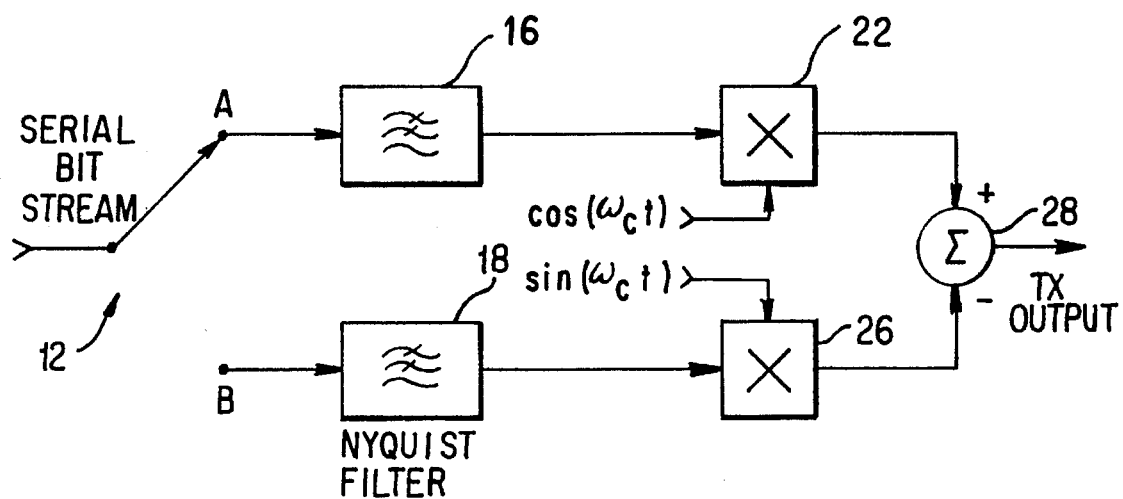
FIG. 2B provides further detail of the QAM/VSB control circuit 12 for separating an input serial data stream according to its symbol rate into in-phase and quadrature components.

Referring now to FIG. 2B, there is shown more particular detail of a QAM/VSB control circuit 12 for a modulator 10 according to the present invention. Serial bit stream is input to a switch for switching between positions A and B according to the symbol duration T. Thus the switch is at position A when t (time) is at 0, T, 2T, 3T and so on and at B when t is at 0.5T, 1.5T, 2.5T and so on where A provides a connection to real arm filter 16 and B provides a connection to imaginary arm filter 18. As already described, the modulator operates at center frequency and the filters 16 and 18 are Nyquist filters. For example, the switch stays at position A for the duration of one half the symbol duration to pass half a symbol to the real arm. Then, the switch switches to B position and resides at B for half a symbol duration to pass the other half of the symbol to the imaginary arm. The switch 12, of course, is appropriately clocked and synchronized to do so with the input serial data bit stream.

Figure 2C:
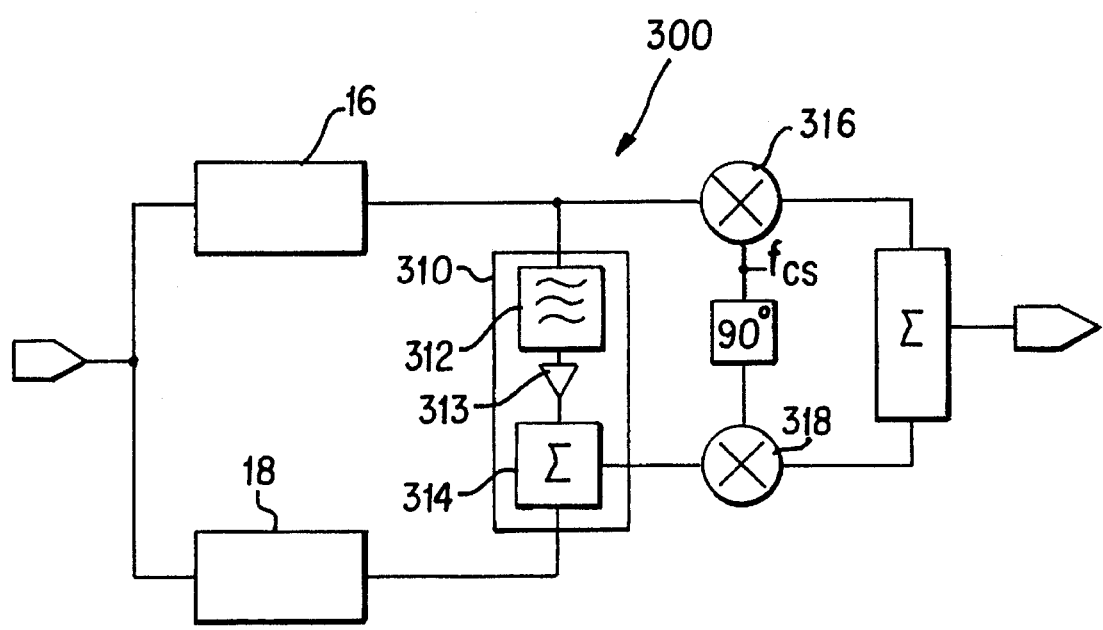
FIG. 2C is a block schematic diagram of a modulator according to the present invention taken substantially from FIG. 33 of my copending application which is an alternate embodiment to that of FIG. 2A but which provides inherent phase noise cancellation.

The modulator 300 of FIG. 2C may be an alternative embodiment to the modulator 10 shown in FIG. 2A. Modulator 300 includes real and imaginary arm filters 16 and 18, preferably Nyquist filters, and transmitter phase noise cancellation circuit 310. Transmitter noise cancellation circuit 310 includes high pass (or band pass) filter 312 and summer 314 for cancelling inherent phase noise produced during the modulation process. The output of summer 314 provides the signal input to second mixer 318, and real arm 16 provides the corresponding signal input to first mixer 316. Modulator 300 controls the shape of the output spectrum in a VSB or QAM modulation circuit. FIG. 2C may be appropriately modified for O-QPSK by incorporating switch 12 of FIG. 2B and operating at $f_{cs}$.

Figure 3A:
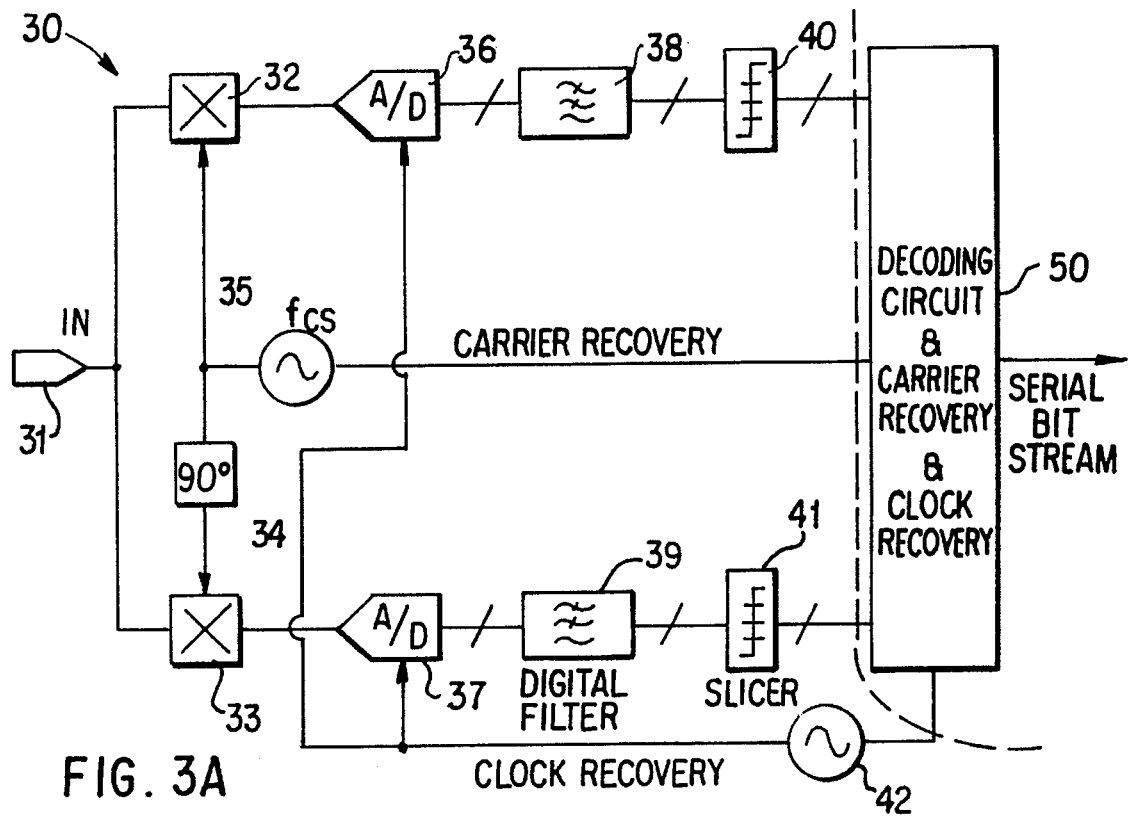
FIG. 3A comprises a block schematic diagram of a demodulator for demodulating a QAM or VSB modulated digital data signal in accordance with the present invention where decoding circuit 50 provides clock recovery control and carrier recovery control and an output data stream.

Referring now to FIG. 3A, there is shown a digital data demodulator/decoder for either a QAM or VSB signal which is to be tuned to the center frequency $f_{cs}$. The input signal received from an antenna, off a cable, an optical fiber and, as appropriate, already passing through a first stage of demodulation to intermediate frequency is provided at input 31. The input signal is provided both to mixers 32 and 33 for mixing with a center carrier frequency in phase or 90° out of phase per Hilbert filter 34. The center carrier frequency is provided by oscillator 35 and adjusted by a carrier frequency control signal output of decoding, carrier and clock recovery circuit 50. For example, oscillator 35 may be a voltage controlled oscillator (VCO) and the carrier recovery lead can reflect a control voltage generated in well known manner to assure that the output $f_{cs}$ does not drift from the center of symmetry of the received information signal spectrum.

Respective outputs of mixers 32 and 33 are provided in turn through analog to digital data converters 36 and 37 operating according to controlled clock outputs of clock oscillator 42. The converted digital data streams respectively output from analog to digital converters 36 and 37 are provided via digital high pass or band pass filters 38 and 39 to decision circuits (data slicers) 40 and 41 which provide binary pulse outputs if a data value, for example, from a received "eye" pattern exceeds an appropriate threshold as distinguished from noise or other possible data values.

The in phase and quadrature digital data streams are then provided to decoding circuit 50. The primary purpose of decoding circuit 50 is to output a decoded serial bit stream, the details of which will be further describe in connection with the following description of FIG. 3B. Decoding circuit 50, in well known manner, provides a carrier recovery control signal for adjusting the carrier frequency $f_{cs}$ output of carrier oscillator 35 in the event it is determined from the incoming data stream that the carrier frequency $f_{cs}$ is drifting to the left or to the right of center of symmetry according to FIG. 1B.

Furthermore, in well known manner, decoding circuit 50 provides a clock recovery control signal for controlling clock oscillator 42 for operating analog to digital converters 36 and 37 according to the data rate. Clock oscillator 42 may be a voltage controlled oscillator (VCO) controlled by a voltage clock frequency control signal generated to assure that the recovered data clock, symbol clocks and all other related data clocks are maintained at appropriate frequency and do not drift.

Figure 3B:
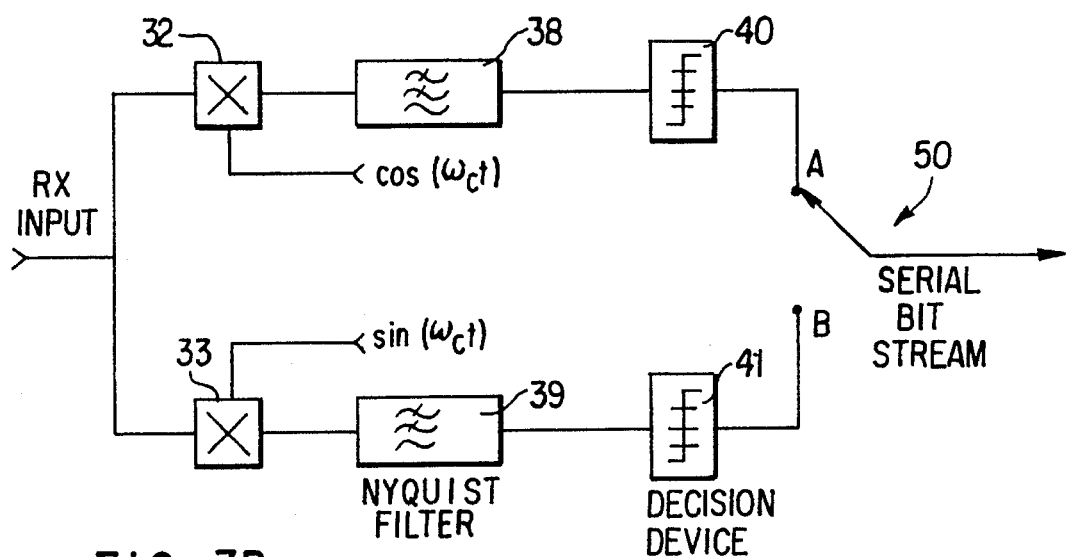
FIG. 3B provides particular detail of decoder 50 for switching between in-phase and quadrature legs of the demodulator circuit according to the symbol rate of the input digital data stream.

Further details of decoding circuit 50 are provided in FIG. 3B in which it is shown that decoding circuit 50 operates as a switch between positions A and B. Moreover, decoding switch 50 operates to switch between position A at the output of data slicer 40 and B at the output of data slicer 41 according to the duration of the incoming data symbol T, just as the analogous switch 12 operated as shown in FIG. 2B. The switch 50 will be at position A when t is at 0, T, 2T, 3T and so on and at position B at t=0.5T, 1.5T, 2.5T and so on. Switch 50 remains in one position or the other for a duration 0.5T to collect half symbols for reconstruction into the input serial bit stream. In accordance with the present invention filters 38 and 39 are shown as Nyquist filters to be consistent with demodulating a received QAM modulated signal. Also, in contrast to FIG. 3A, FIG. 3B shows mixers 32 and 33 fed by the cosine and sine of the carrier frequency, shorthand for indicating their being 90 degrees out-of-phase. While $\omega_{ct}$ is utilized as a symbol, it is intended that the angular velocity $\omega$ is related as is well known to frequency by $\omega=2*(\pi)*f$, where t represents the passage of time.

Thus, according to the present invention, a QAM demodulator incorporating Nyquist filtering and set to tune to center frequency demodulates a vestigial sideband modulated data signal by switching together the separated symbol outputs of real and imaginary arms to form a serial data stream according to the duration of a transmitted symbol.

Having described preferred embodiments of a novel QAM/VSB modulator and, in particular, a demodulator/decoder for decoding either QAM or VSB, it is seen that substantially the same circuitry and tuning (carrier) frequency are utilized for demodulating either transmitted signal; moreover, no data is lost during the demodulation/decoding process. Modifications and variations to the principles herein described can be made by those skilled in the art to extend the present teachings to, for example, 4-VSB or 16-QAM or other more complicated data structures. Moreover, the present invention may be utilized in each of many transmission media including, but not limited to, satellite, cable, optical fiber or over-the-air transmission media.

The depicted embodiments are not intended to be limiting but may be adapted for utilization in particular applications depending on economics, reliability and other considerations. What is a preferred embodiment for one particular application may not be preferred in another application. The depicted circuitry, for example, may be in the form of integrated circuits and, in the instance of at least the decoding circuit 50, in the form of an application specific integrated circuit.

Having thus described the invention with the details and particularity required, what is claimed and desired protected by Letters Patent is set forth in the following claims.

What is claimed is:

1. A synchronous detector for recovering a demodulated output digital data signal from a transmitted input digital data signal regardless of whether the transmitted input digital data stream is modulated according to a vestigial sideband or a quadrature amplitude modulation scheme, the synchronous detector comprising a tuner tuned to a center carrier frequency of a modulated data spectrum, the tuner comprising real and imaginary arms and a decoder for receiving digital data sequences from the real and imaginary arms, the decoder selectively operating according to the duration of a transmitted data symbol.

2. A synchronous detector according to claim 1 wherein the center carrier frequency of the modulated data spectrum comprises the frequency value of the center of symmetry of the transmitted information amplitude versus frequency spectrum.

3. A synchronous detector according to claim 1, the real and imaginary arms each comprising a mixer, an analog to digital converter coupled to the mixer and a data slicer for outputing in phase and quadrature digital data sequences respectively.

4. A synchronous detector according to claim 3, the real and imaginary arms each further comprising a Nyquist filter coupled to the outputs of the respective analog to digital converters for filtering the respective digital signals to be provided to the respective data slicers.

5. A synchronous detector according to claim 1, the decoder particularly comprising a two position switch for switching between an output of the real arm and an output of the imaginary arm, the switch remaining in each position for a duration 0.5T equal to one half the duration T of the transmitted data symbol.

6. A synchronous detector according to claim 5, the switch switching to the real arm position at time t equal to T, 2T, 3T and so on and switching to the imaginary arm position at time t equal to 0.5T, 1.5T, 2.5T and so on.

7. A modulator for modulating a digital data stream according to either a VSB or QAM modulation scheme, the modulator comprising a control circuit for alternately switching an input digital data stream to be modulated between a real arm and an imaginary arm and a modulator for modulating the digital data stream such that the carrier frequency is approximately symmetrically centered about the modulated data amplitude versus frequency spectrum.

8. The modulator according to claim 7, the control circuit comprising a switch for switching between the real and imaginary arms such that the switch is connected to one or the other arm for a duration of one half the duration of a transmitted data symbol.

9. The modulator according to claim 8, the switch being connected to the real arm at time t equal to T, the duration of one symbol, 2T, 3T and so on and being connected to the imaginary arm at time t equal to 0.5T, 1.5T, 2.5T and so on.

10. The modulator according to claim 7, the real and imaginary arms each comprising a Nyquist filter and a mixer.

11. The modulator according to claim 7 further comprising a cancellation circuit coupled between the real and imaginary arms.

12. The modulator according to claim 11, the cancellation circuit comprising a jitter cancellation filter, a scaling circuit for scaling the output of the filter according to a factor k, which may comprise a resistor or an amplifier, and a summation circuit for summing the scaled output of the scaling circuit with the output of an imaginary arm filter.

13. A method of demodulating and decoding a digital data stream modulated according to either a vestigial sideband or a quadrature amplitude modulation scheme, the method comprising the steps of tuning in each of an in phase and a quadrature arm of a demodulator to a center frequency of the modulated data spectrum and reconstructing the digital data stream according to the symbol rate of the transmitted digital data stream.

14. A method of demodulating and decoding a digital data stream according to claim 13 wherein the digital data stream reconstruction step comprises the steps of converting the output of a mixer in each arm to a digital signal and deciding whether the recovered signal exceeds a predetermined threshold.

15. A method of demodulating and decoding a digital data stream according to claim 13 wherein the digital data stream reconstruction step comprises the step of switching between in phase and quadrature arms according to half the duration of a transmitted data symbol.

16. A method of demodulating and decoding a digital data stream according to claim 13 further comprising the step of subtracting transmitted carrier signal from a received signal.

17. A method of modulating a digital data signal according to either a vestigial sideband or quadrature amplitude modulation scheme comprising the steps of switching to real and imaginary arms of a modulator according to the duration of a transmitted data symbol and modulating the digital data stream about a carrier frequency symmetrically centered in the modulated digital data signal spectrum.

18. A method of modulating a digital data signal according to claim 15 further comprising the step of canceling phase noise between the real and imaginary arms.

* * * * *